(12) United States Patent
Davies et al.

(10) Patent No.: US 6,337,584 B1
(45) Date of Patent: Jan. 8, 2002

(54) METHOD AND APPARATUS FOR REDUCING BIPOLAR CURRENT EFFECTS IN SILICON-ON-INSULATOR (SOI) DYNAMIC LOGIC CIRCUITS

(75) Inventors: Andrew Douglas Davies; Daniel Lawrence Stasiak; Frederick Jacob Ziegler, all of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/382,760

(22) Filed: Aug. 25, 1999

(51) Int. Cl.[7] ............................................... H03K 19/20
(52) U.S. Cl. ........................ 326/121; 326/98; 326/95; 326/290
(58) Field of Search ............................ 326/93, 95, 98, 326/119, 112, 59, 121, 97, 108

(56) References Cited

U.S. PATENT DOCUMENTS

| | | | |
|---|---|---|---|
| 5,831,452 A | * 11/1998 | Novak et al. | ................ 326/98 |
| 5,838,169 A | 11/1998 | Schorn | ........................ 326/98 |
| 5,852,373 A | * 11/1998 | Chu et al. | ..................... 326/98 |
| 6,046,606 A | * 4/2000 | Chu et al. | ..................... 326/95 |
| 6,052,008 A | * 4/2000 | Chu et al. | ................... 327/200 |

\* cited by examiner

*Primary Examiner*—Michael Tokar
*Assistant Examiner*—Joseph Lauture
(74) *Attorney, Agent, or Firm*—Bracewell & Patterson

(57) ABSTRACT

A method and apparatus for reducing bipolar current effects in dynamic logic circuits that are fabricated using the SOI technology is disclosed. A dynamic logic circuit capable of reducing bipolar current effects includes a precharge transistor (or a discharge transistor), a pass transistor, a functional logic circuit block, and an inverter. Connected in series with the precharge transistor, the functional logic circuit block, which includes multiple transistors, receives signal inputs. The pass transistor, connected in parallel with the precharge transistor, receives an identical input as one of the many transistors within the functional logic circuit block. The inverter, connected to a node between the precharge transistor and the functional logic circuit block, provides an output for the dynamic logic circuit.

17 Claims, 3 Drawing Sheets

METHOD AND APPARATUS FOR REDUCING BIPOLAR CURRENT EFFECTS IN SILICON-ON-INSULATOR (SOI) DYNAMIC LOGIC CIRCUITS

BACKGROUND OF THE INVENTION

1. Technical Field

The present invention relates to integrated circuits in general, and in particular to a method and apparatus for reducing bipolar current effects in integrated circuits. Still more particularly, the present invention relates to a method and apparatus for reducing bipolar current effects in Silicon-On-Insulator (SOI) dynamic logic integrated circuits.

2. Description of the Prior Art

Among integrated circuit design families, dynamic logic circuits offer significant advantages over their static logic circuit counterparts, particularly in performance and chip area requirements. Therefore, it is desirable to use dynamic logic circuits to implement as much of the logic function of an integrated circuit design as possible. Generally speaking, dynamic logic circuits use a stored charge to represent a logic state. In operation, the charge is usually stored at a storage node during a precharge phase, and the charge is then conditionally discharged during an evaluation phase.

In recent years, the predominant processing technology for fabricating integrated circuits has been the Complementary-Metal-Oxide Silicon (CMOS) technology using silicon substrates. Although CMOS technology offers various advantages, such as low power consumption and stability, over other types of processing technologies, there are also several drawbacks associated with CMOS circuits, such as relatively slow speed and potential latch-up problems. In light of such, a new processing technology called Silicon-On-Insulator (SOI) technology has emerged. Instead of using an electrically conducting substrate like the CMOS technology, SOI utilizes an insulating substrate. A detailed description of the SOI technology can be found in Weste and Eshraghian, *Principles of CMOS VLSI Design: A Systems Perspective*, 2nd ed., pp. 125–130, Addison Wesley (1995), the pertinent portion of which is incorporated herein by reference.

With an insulating substrate, SOI technology provides tremendous improvements in certain circuit characteristics, such as speed and latch-up, over CMOS technology. However, when dynamic logic circuits are fabricated using SOI technology instead of the CMOS counterpart, a problem known as bipolar current effect becomes more dominant. In fact, bipolar current effect arising from SOI technology is considered a more series problem than the charge sharing problem attributed to CMOS technology. Therefore, it is desirable to provide a method and apparatus for reducing bipolar current effects in dynamic logic circuits that are fabricated using SOI technology.

SUMMARY OF THE INVENTION

In accordance with a preferred embodiment of the present invention, a dynamic logic circuit capable of reducing bipolar current effects includes a precharge transistor (or a discharge transistor), a pass transistor, a functional logic circuit block, and an inverter. Connected in series with the precharge transistor, the functional logic circuit block, which includes multiple transistors, receives signal inputs. The pass transistor, connected in parallel with the precharge transistor, receives an identical input as one of the many transistors within the functional logic circuit block. The inverter, connected to a node between the precharge transistor and the functional logic circuit block, provides an output for the dynamic logic circuit.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
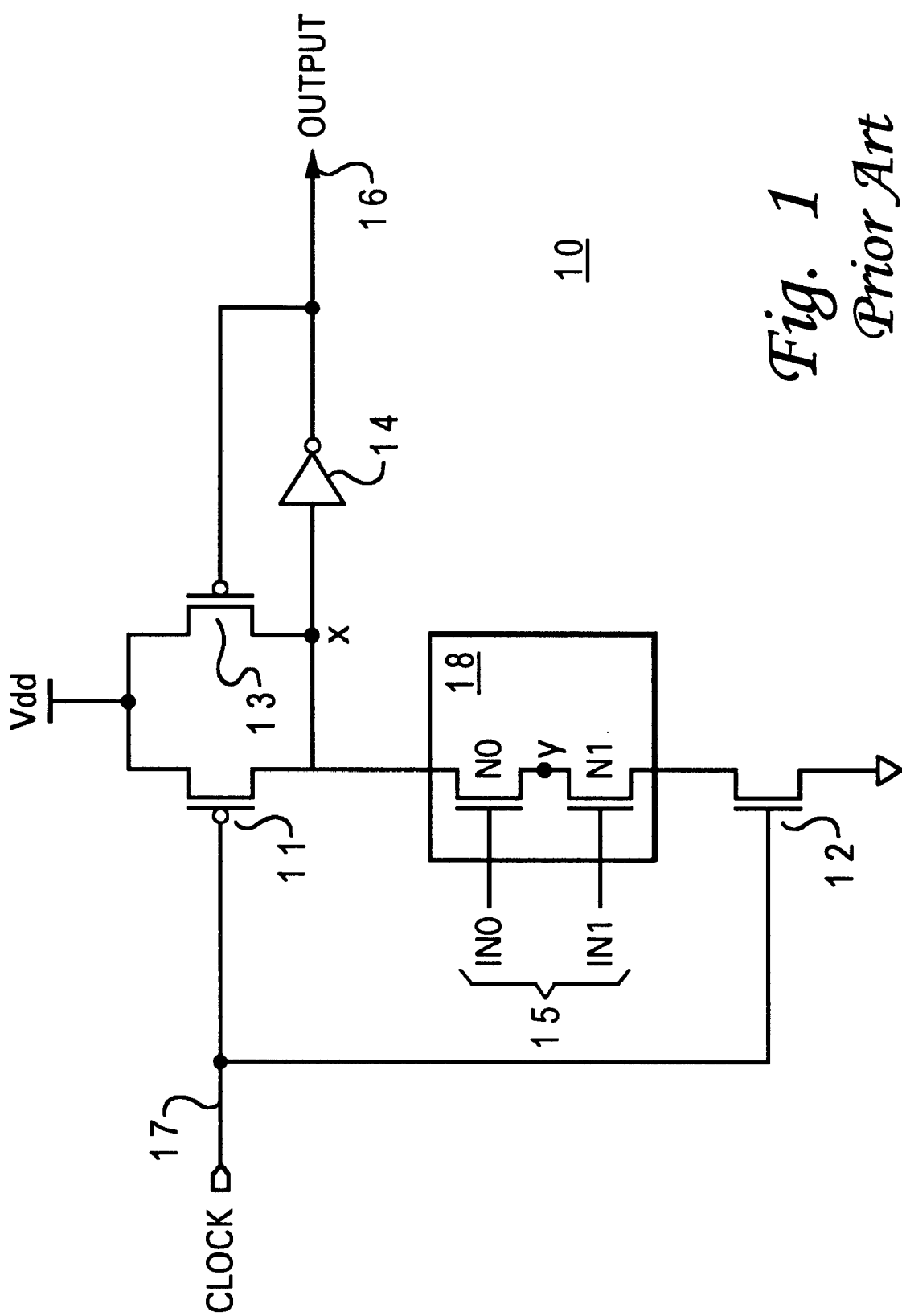
FIG. 1 is a circuit diagram of a dynamic logic circuit in accordance with the prior art.

Referring now to the drawings and in particular to FIG. 1, there is depicted a circuit diagram of a dynamic logic circuit in accordance with the prior art. As shown, dynamic logic circuit 10 includes transistors 11–13, an inverter 14, inputs 15, an output 16, a clock line 17, and a logic circuit block 18. Transistors 11, 13 are p-channel transistors and transistor 12 is an n-channel transistor. Logic circuit block 18 typically includes multiple n-channel transistors connected in various logic combinations according to different needs. In this example, logic circuit block 18 includes two n-channel transistors N0, N1 connected in series to form a two-input NAND gate.

In operation, during a precharge phase, when a clock signal on clock line 17 is at a low state, transistor 11 precharges node x to $V_{dd}$ (a high state). Because node x is charged to $V_{dd}$, output 16 will be at a low state. During an evaluation phase, when the clock signal on clock line 17 transitions to a high state, transistor 11 becomes non-conducting while transistors 12, 13 become conducting. At this time, inputs 15 will be evaluated by logic gates within logic block 18. To keep the voltage at node x set at $V_{dd}$, transistor 12 remains conducting until the voltage at output 16 becomes high. Transistor 13 is a weak device because it must be able to be pulled down by transistor 12 and the logic gates within logic circuit block 18.

After the precharge phase, as mentioned earlier, node x is at $V_{dd}$ and output 16 is at a low state. In order to illustrate the problem of bipolar current effect, node y within logic circuit block 18 is assumed to be at a high state (such as $V_{dd}$) at this point. Furthermore, node y did not reach the high state by a direct charge from transistor 11 but by a previous evaluation phase in which IN0 transitioned high and IN1 stayed low. Node y could also reach the high state via leakage through transistor N0. In either case, dynamic logic circuit 10 is in this state at the beginning of the next evaluation phase. If IN0 remains at a low state and IN1 transitions to a high state during the evaluation phase, node y will fall from a high state to ground (a low state). When node y falls from a high state to a low state, bipolar current flowing through transistor N0 will remove charge from precharge node x. This phenomenon is known as the bipolar current effect. The bipolar current effect varies according to the body voltage of transistor N0. Thus, the bipolar current effect is at its worst when the body voltage of transistor N0 is high.

Figure 2:
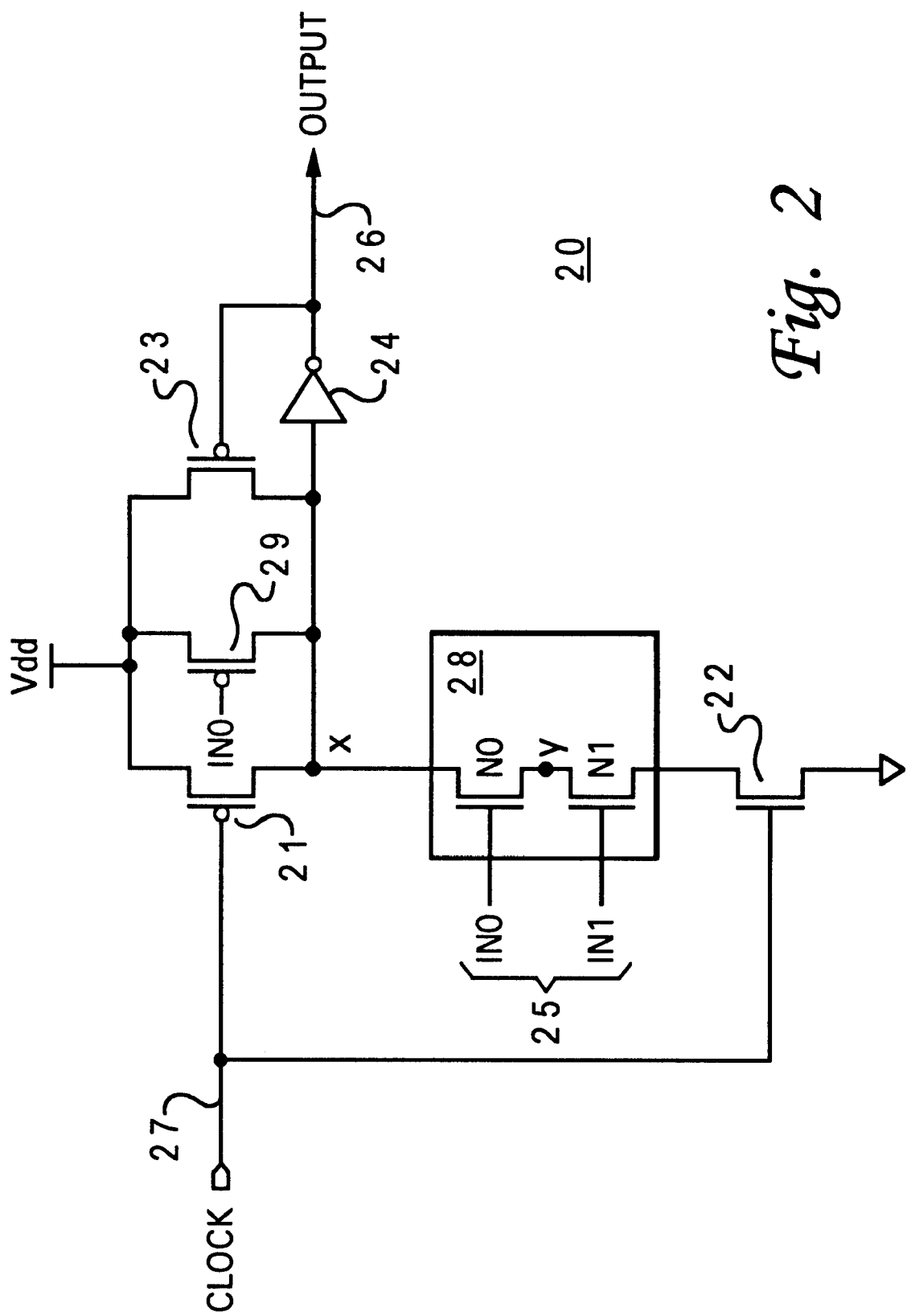
FIG. 2 is a circuit diagram of a dynamic logic circuit in accordance with a preferred embodiment of the present invention.

With reference now to FIG. 2, there is depicted a circuit diagram of a dynamic logic circuit in accordance with a preferred embodiment of the present invention. As shown, dynamic logic circuit 20 includes a precharge transistor 21, an isolation transistor 22, a feedback transistor 23, and a pass transistor 29. Preferably, precharge transistor 21, feedback transistor 23, and pass transistor 29 are n-channel transistors, and isolation transistor 22 is a p-channel transistor. In addition, dynamic logic circuit 20 also includes an inverter 24, inputs 25, an output 26, a clock line 27, and a logic circuit block 28. Logic circuit block 28, in this implementation, includes two n-channel transistors N0, N1 connected in series to form an NAND gate, but it should be understood by those skilled in the art that logic circuit block 28 may include various types of logic circuit combinations.

The above-mentioned bipolar current effect can be prevented by driving more current into a dynamic node in which the condition for bipolar current occurs. For dynamic logic circuit 20, precharge node x is the dynamic node in which the condition for bipolar current would occur. As a preferred embodiment of the present invention, additional current can be injected into node x via pass transistor 29. As shown, the source of pass transistor 29 is connected to $V_{dd}$, the drain of pass transistor 29 is connected to precharge node x, and the gate of pass transistor 29 is connected to an input from one of the transistors within logic circuit block 28. This one transistor within logic circuit block 28 is preferably the transistor directly connected to precharge transistor 21, and pass transistor 29 is of a different transistor type from this one transistor. For dynamic logic circuit 20, transistor N0 is the transistor directly connected to precharge transistor 21; thus IN0 is also the input for pass transistor 29. Further, because transistor N0 is an n-channel transistor (which is typically the case for all transistors within logic circuit block 28), pass transistor 29 is a p-channel transistor.

Without pass transistor 29, bipolar current effect will occur in dynamic logic circuit 20 when the clock signal in clock line 27 and the input signal at IN1 are transitioning from a low state to a high state while the input signal at IN0 is at a low state and node y is at a high state from a previous evaluation phase, which allows transistor N0 having a bipolar leakage to pull charge away from precharge node x. But with dynamic logic circuit 20 having pass transistor 29, pass transistor 29 is turned on at this time because input signal at IN0 is at a low state. As a result, pass transistor 29 injects charge into precharge node x, thus reducing the bipolar current effect. This technique is not pseudo-static dynamic logic because pass transistor 29 is simply added to the prior art circuit rather than an entire complementary p-channel transistor network. Because the role of pass transistor 29 is to feed bipolar current to precharge node x in order to maintain precharge node x at a high state, the size of transistor 29 can be relatively small. The small size of transistor 29 minimizes performance degradation of dynamic logic circuit 20.

Figure 3:
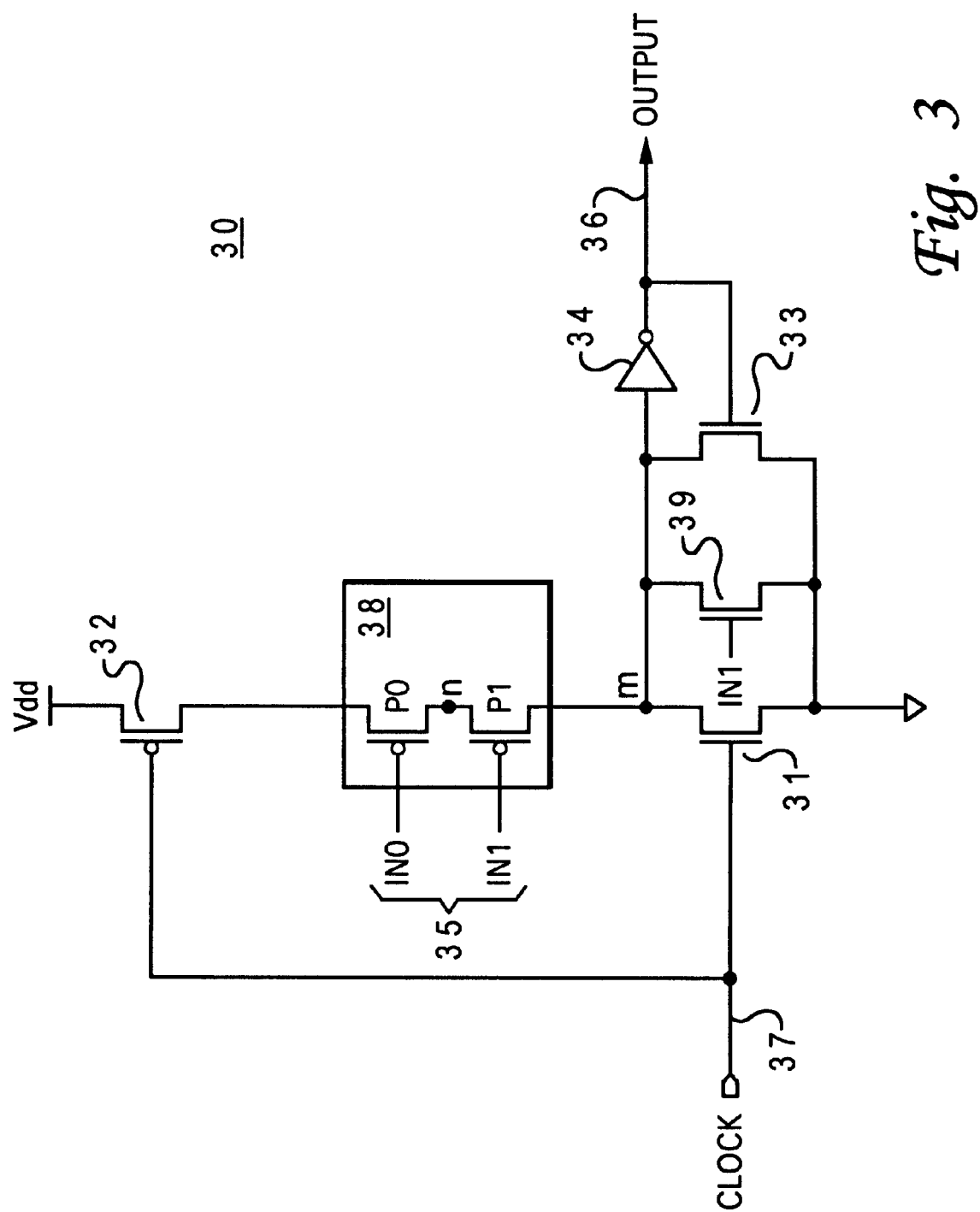
FIG. 3 is a circuit diagram of a dynamic logic circuit in accordance with an alternative embodiment of the present invention.

Referring now to FIG. 3, there is depicted a circuit diagram of a circuit diagram of a dynamic logic circuit in accordance with an alternative embodiment of the present invention. Similar to dynamic logic circuit in FIG. 2, dynamic logic circuit 30 includes a discharge transistor 31, an isolation transistor 32, a feedback transistor 33, and a pass transistor 39. Discharge transistor 31, feedback transistor 33, and pass transistor 39 are all n-channel transistors. Isolation transistor 32 is a p-channel transistor. In addition, dynamic logic circuit 30 also includes an inverter 34, p-channel transistors P0–P1, an output 36, and a clock line 37.

For dynamic logic circuit 30, bipolar current effect is prevented by draining more current from a dynamic node in which the condition for bipolar current occurs. Discharge node m is the dynamic node in which the condition for bipolar current would occur. As a preferred embodiment of the present invention, additional charge can be drained from node m via pass transistor 39. As shown, the drain of pass transistor 39 is connected to discharge node m, the source of pass transistor 39 is connected to ground, and the gate of pass transistor 39 is connected to an input from one of the transistors within logic circuit block 38. This one transistor within logic circuit block 38 is preferably the transistor directly connected to discharge transistor 31, and pass transistor 39 is of a different transistor type from this one transistor. For dynamic logic circuit 30, transistor P1 is the transistor directly connected to discharge transistor 31, thus IN1 is also the input for pass transistor 39. Further, because transistor P1 is a p-channel transistor (which is typically the case for all transistors within logic circuit block 38), pass transistor 39 is an n-channel transistor.

Without pass transistor 39, bipolar current effect will occur in dynamic logic circuit 30 when the clock signal in clock line 37 and the input signal at IN0 are transitioning from a high state to a low state while the input signal at IN1 is at a high state and node n is at a low state from a previous evaluation phase, which allows transistor P1 having a bipolar leakage to add charge to discharge node m. But with dynamic logic circuit 30, pass transistor 39 is turned on at this time because input signal at IN1 is at a high state. As a result, pass transistor 39 drains charge away from discharge node m, thus reducing the bipolar current effect. Because the role of pass transistor 39 is to drain bipolar current from discharge node m in order to maintain discharge node m at a low state, the size of transistor 39 can be relatively small.

As has been described, the present invention provides a method and apparatus for reducing bipolar current effects in dynamic logic circuits that are fabricated using SOI technology. With the addition of a pass transistor in a dynamic logic circuit, the bipolar current effect is reduced or even eliminated.

While the invention has been particularly shown and described with reference to a preferred embodiment, it will be understood by those skilled in the art that various changes in form and detail may be made therein without departing from the spirit and scope of the invention.

What is claimed is:

1. A dynamic logic integrated circuit with reduced bipolar current effect, said dynamic logic integrated circuit comprising:

a charge transistor;

a functional logic circuit block, coupled to said charge transistor, for receiving inputs, wherein said functional logic circuit includes a plurality of transistors; and a pass transistor, connected in parallel with said charge transistor, for receiving an identical input as one of said plurality of transistors within said functional logic circuit block, wherein said one of said plurality of transistors within said functional logic circuit block having an identical input as said pass transistor is directly connected to said charge transistor, wherein said charge transistor, said pass transistor, and said one of said plurality of transistors within said function logic circuit block having an identical input as said pass transistor are connected to each other via a common node.

2. The dynamic logic integrated circuit according to claim 1, wherein said pass transistor is of an opposite type from said one of said plurality of transistors within said function logic circuit block having an identical input as said pass transistor.

3. The dynamic logic integrated circuit according to claim 1, wherein said charge transistor can be a precharge transistor or a discharge transistor.

4. The dynamic logic integrated circuit according to claim 1, wherein said dynamic logic integrated circuit further includes an inverter, connected to a node between said charge transistor and said functional logic circuit block, for providing an output of said dynamic logic integrated circuit.

5. The dynamic logic integrated circuit according to claim 1, wherein said dynamic logic integrated circuit further includes a clock for generating a clock signal to said charge transistor.

6. The dynamic logic integrated circuit according to claim 1, wherein said transistors within said dynamic logic integrated circuit are Silicon-On-Insulator transistors.

7. The dynamic logic integrated circuit according to claim 1, wherein said pass transistor is a p-channel transistor.

8. The dynamic logic integrated circuit according to claim 1, wherein said pass transistor is an n-channel transistor.

9. A method for reducing bipolar current effect in a dynamic logic integrated circuit, wherein said dynamic logic integrated circuit includes a charge transistor coupled to a functional logic circuit block having a plurality of transistors, said method comprising the steps of:

connecting a pass transistor in parallel with said charge transistor, wherein said pass transistor receives an identical input as one of said plurality of transistors within said functional logic circuit block, wherein said one of said plurality of transistors within said functional logic circuit block having an identical input as said pass transistor is directly connected to said charge transistor, wherein said charge transistor, said pass transistor, and said one of said plurality of transistors within said function logic circuit block having an identical input as said pass transistor are connected to each other via a common node; and injecting charge by said pass transistor to a charge node located between said charge transistor and said functional logic circuit block during an evaluation phase of said dynamic logic integrated circuit.

10. The method according to claim 9, wherein said pass transistor is of an opposite type from said one of said plurality of transistors within said function logic circuit block having an identical input as said pass transistor.

11. The method according to claim 9, wherein said charge transistor can be a precharge transistor or a discharge transistor.

12. The method according to claim 9, wherein said transistors within said dynamic logic integrated circuit are Silicon-On-Insulator transistors.

13. The method according to claim 9, wherein said pass transistor is a p-channel transistor.

14. The method according to claim 9, wherein said pass transistor is an n-channel transistor.

15. A dynamic logic integrated circuit with reduced bipolar current effect, said dynamic logic integrated circuit comprising:

a discharge transistor;

a functional logic circuit block, coupled to said charge transistor, for receiving inputs, wherein said functional logic circuit includes a plurality of transistors; and a pass transistor, connected in parallel with said discharge transistor between said functional logic circuit and ground, for receiving an identical input as one of said plurality of transistors within said functional logic circuit block.

16. The dynamic logic integrated circuit according to claim 15, wherein said one of said plurality of transistors within said functional logic circuit block is a transistor directly connected to said charge transistor.

17. The dynamic logic integrated circuit according to claim 15, wherein said pass transistor is of an opposite type from said one of said plurality of transistors within said function logic circuit block with which said identical input is received, wherein said discharge transistor, said pass transistor, and said one of said plurality of transistors within said function logic circuit block having an identical input as said pass transistor are connected to each other via a common node.

* * * * *